United States Patent
Hudson et al.

(10) Patent No.: US 11,842,785 B2
(45) Date of Patent: Dec. 12, 2023

(54) TEMPERATURE-ACCELERATED SOLID-STATE STORAGE TESTING METHODS

(71) Applicant: Dell Products L.P., Round Rock, TX (US)

(72) Inventors: Samuel Hudson, Foxborough, MA (US); Michael Rijo, Seekonk, MA (US); Robert Proulx, Holden, MA (US)

(73) Assignee: Dell Products L.P., Round Rock, TX (US)

( * ) Notice: Subject to any disclaimer, the term of this patent is extended or adjusted under 35 U.S.C. 154(b) by 118 days.

(21) Appl. No.: 17/716,069

(22) Filed: Apr. 8, 2022

(65) Prior Publication Data

US 2023/0326541 A1 Oct. 12, 2023

(51) Int. Cl.
*G11C 29/50* (2006.01)
(52) U.S. Cl.
CPC ........ *G11C 29/50004* (2013.01); *G11C 2029/5004* (2013.01)

(58) Field of Classification Search
CPC .............. G11C 29/50004; G11C 29/5004
See application file for complete search history.

(56) References Cited

U.S. PATENT DOCUMENTS 9,165,668 B1 * 10/2015 Zhao ............... G11C 16/349

* cited by examiner

*Primary Examiner* — April Y Blair
*Assistant Examiner* — Rong Tang
(74) *Attorney, Agent, or Firm* — Joseph Mencher

(57) ABSTRACT

A temperature-accelerated solid-state storage testing method includes writing data to a storage system and subjecting the storage system to a first temperature range for a first time period that is equivalent to operation at a lower/second temperature for a greater/second time period. Subsequently, the data from the storage system is read within a third time period at a third temperature range to generate first test data. The storage system is then subjected to the first temperature range for a fourth time period that was reduced relative to the first time period based on the reading of the data to generate the first test data causing the operation of storage system to be equivalent to operating at the second temperature range for a fifth time period. Subsequently the data from the storage system is read within the third time period at the third temperature range to generate second test data.

20 Claims, 13 Drawing Sheets

| STEP | BAKE TIME (85C) (hours) | 40C EQUIVALENT TIME (days) LP (Ea 1.0) |
|---|---|---|
| 1 | 6.9 | 30.0 |
| 2 | 13.7 | 60.0 |
| 3 | 20.5 | 90.0 |
| 4 | 27.4 | 120.0 |
| 5 | 41.1 | 180.0 |
| 6 | 83.3 | 365.0 |

| STEP | BAKE TIME (85C) (hours) | READ SCAN (55C) (hours) | 40C EQUIVALENT TIME (days) LP (Ea 1.0) | ACTUAL 40C EQUIVALENT AFTER READ SCAN (days) |
|---|---|---|---|---|
| 1 | 6.9 | 6.0 | 30.0 | 31.4 |
| 2 | 13.7 | 6.0 | 1.4 60.0 | 62.8 |
| 3 | 20.5 | 6.0 | 1.4 90.0 | 94.2 |
| 4 | 27.4 | 6.0 | 1.4 120.0 | 125.6 |
| 5 | 41.1 | 6.0 | 1.4 180.0 | 187.0 |
| 6 | 83.3 | 6.0 | 1.4 365.0 | 373.4 |
| | | | 1.4 | |

| STEP | BAKE TIME (85C) (hours) | READ SCAN (55C) (hours) | 40C EQUIVALENT TIME (days) LP (Ea 1.0) |
|---|---|---|---|
| 1 | 6.9 | | 30.0 |
| | | 6.0 | 1.4 |
| 2 | 13.4 | | 58.6 |
| | | 6.0 | 1.4 |
| 3 | 19.8 | | 87.2 |
| | | 6.0 | 1.4 |
| 4 | 26.4 | | 115.8 |
| | | 6.0 | 1.4 |
| 5 | 39.7 | | 174.1 |
| | | 6.0 | 1.4 |
| 6 | 81.6 | | 357.8 |
| | | 6.0 | 1.4 |

| STEP | BAKE TIME (85C) (hours) | 40C EQUIVALENT TIME (days) | | |
|---|---|---|---|---|
| | | LP (Ea 1.0) | MP (Ea 0.97) | UP (Ea 0.94) |
| 1 | 6.9 | 30.0 | 26.1 | 22.7 |
| 2 | 7.9 | 34.6 | 30.0 | 26.1 |
| 3 | 9.1 | 39.7 | 34.5 | 30.0 |
| 4 | 13.7 | 60.0 | 52.2 | 45.4 |
| 5 | 15.7 | 69.0 | 60.0 | 52.2 |
| 6 | 18.1 | 79.4 | 69.0 | 60.0 |
| 7 | 20.5 | 90.0 | 78.2 | 68.0 |
| 8 | 23.6 | 103.5 | 90.0 | 78.3 |
| 9 | 27.2 | 119.1 | 103.5 | 90.0 |
| 10 | 27.4 | 120.0 | 104.4 | 90.8 |
| 11 | 31.5 | 138.0 | 120.0 | 104.4 |
| 12 | 36.2 | 158.6 | 138.0 | 120.0 |

(Prior Art)
FIG. 7

| STEP | BAKE TIME (85C) (hours) | 40C EQUIVALENT TIME (days) | | |
|---|---|---|---|---|
| | | LP (Ea 1.0) | MP (Ea 0.97) | UP (Ea 0.94) |
| 1 | 7.4 | 32.4 | 28.2 | 24.5 |
| 2 | 9.1 | 39.7 | 34.5 | 30.0 |
| 3 | 14.8 | 64.9 | 56.4 | 49.1 |
| 4 | 18.1 | 79.4 | 69.0 | 60.0 |
| 5 | 22.5 | 98.7 | 85.8 | 74.6 |
| 6 | 27.2 | 119.1 | 103.5 | 90.0 |
| 7 | 31.5 | 138.0 | 120.0 | 104.4 |
| 8 | 36.2 | 158.6 | 138.0 | 120.0 |

FIG. 8

| STEP | BAKE TIME (85C) (hours) | READ SCAN (55C) (hours) | 40C EQUIVALENT TIME (days) | | |
|---|---|---|---|---|---|
| | | | LP (Ea 1.0) | MP (Ea 0.97) | UP (Ea 0.94) |
| 1 | 7.4 | | 32.4 | 28.2 | 24.5 |
| | | 6.0 | 1.4 | 1.3 | 1.2 |
| 2 | 8.8 | | 39.7 | 34.9 | 30.4 |
| | | 6.0 | 1.4 | 1.3 | 1.2 |
| 3 | 14.4 | | 64.9 | 56.2 | 49.0 |
| | | 6.0 | 1.4 | 1.3 | 1.2 |
| 4 | 17.8 | | 79.4 | 69.2 | 60.3 |
| | | 6.0 | 1.4 | 1.3 | 1.2 |
| 5 | 22.2 | | 98.7 | 86.0 | 74.9 |
| | | 6.0 | 1.4 | 1.4 | 1.4 |
| 6 | 26.9 | | 119.3 | 103.9 | 90.4 |
| | | 6.0 | 1.4 | 1.3 | 1.2 |

FIG. 9

TEMPERATURE-ACCELERATED SOLID-STATE STORAGE TESTING METHODS

BACKGROUND

The present disclosure relates generally to information handling systems, and more particularly to temperature-accelerated testing of solid-state storage systems used with information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as server devices, desktop computing devices, laptop/notebook computing devices, tablet computing devices, mobile phones, and/or other computing devices known in the art, often utilize solid-state storage systems for the storage of data. As will be appreciated by one of skill in the art, data read from such solid-state storage systems often includes errors, and solid-state storage systems are tested during their development in order to generate testing results that are then utilized to provide for the configuration of the solid-state storage systems in a manner that minimizes such errors, ensure that errors included in data read from solid-state storage systems during their lifetime are at acceptable levels, and/or perform other testing-result-driven operations known in the art. However, the JEDEC Solid State Technology Association defines a target life of solid-state NAND storage systems as 1.5 years, while data retention targets for solid-state NAND storage systems often require the reliable storage of data for 3 months at 40 degrees Celsius (40 C), and one of skill in the art will appreciate how these and similar time periods are impractically long for the purposes of testing.

In a specific example, solid-state NAND storage systems store data as analog voltages in NAND memory cells, and those voltages may be impacted by a variety of physical mechanisms that will introduce errors into the data stored in the solid-state NAND storage systems. However, the physical mechanisms that impact the voltages stored in solid-state NAND storage systems may be accelerated via increased temperature, which allows the testing of solid-state NAND storage systems at elevated temperatures in order to reduce the duration of testing. As will be appreciated by one of skill in the art, an Arrhenius relationship may be identified for solid-state NAND storage systems and used to determine an activation energy (Ea) that governs how a physical mechanism impacts the voltages stored in solid-state NAND storage systems, and one of skill in the art in possession of the present disclosure will recognize how that activation energy (Ea) may be used to determine an elevated temperature that will provide a reduced duration of testing for solid-state NAND storage systems to achieve a testing result (e.g., for NAND memory cells with an activation energy of 1.1, data retention testing for 2.17 days at 85 degrees Celsius (85 C) will achieve the same results as data retention testing for 1 year at 40 C). However, the inventors of the present disclosure have discovered that conventional methodologies for temperature-accelerated solid-state NAND storage system testing suffer from issues that result in inaccurate testing results, which in turn reduces the efficacy of the testing-result-driven operations discussed above that are performed based on those testing results.

Accordingly, it would be desirable to provide temperature-accelerated solid-state storage testing methods that address the issues discussed above.

SUMMARY

According to one embodiment, a temperature-accelerated solid-state storage testing method includes writing data to a first page, a second page, and a third page in a storage system; subjecting the storage system to a first temperature range for a first time period in order to 1) cause the operation of the first page in the storage system to be equivalent to operating at a second temperature range that is less than the first temperature range and for a second time period that is greater than the first time period and within a threshold of a target temperature-accelerated time period, and 2) cause the operation of the second page in the storage system to be equivalent to operating at the second temperature range for a third time period that is greater than the first time period and within the threshold of the target temperature-accelerated time period; reading, subsequent to the first time period using a single read scan operation and within a fourth time period at a third temperature range that is less than the first temperature range, the data from the first page and the second page in the storage system to generate first test data; subjecting the storage system to the first temperature range for a fifth time period that is less than the first time period and that was reduced based on the reading of the data from the first page and the second page in the storage system within the fourth time period at the third temperature range causing the operation of storage system to be equivalent to operating at the second temperature range for a sixth time period; and reading, subsequent to the fifth time period and within the fourth time period at the third temperature range, the data from the third page in the storage system to generate second test data.

BRIEF DESCRIPTION OF THE DRAWINGS

FIG. 4 is a table view illustrating an embodiment of a conventional temperature-accelerated solid-state storage testing schedule.

FIG. 5A is a table view illustrating an embodiment of a temperature-accelerated solid-state storage testing schedule that may be performed during the method of FIG. 3.

FIG. 5B is a table view illustrating an embodiment of a read-scan-compensated temperature-accelerated solid-state storage testing schedule that may be performed during the method of FIG. 3.

FIG. 7 is a table view illustrating an embodiment of a conventional temperature-accelerated solid-state storage testing schedule.

FIG. 8 is a table view illustrating an embodiment of a temperature-accelerated solid-state storage testing schedule that may be performed during the method of FIGS. 6A and 6B.

FIG. 9 is a table view illustrating an embodiment of a temperature-accelerated solid-state storage testing schedule that may be performed during a combination of the methods of FIGS. 3 and 9.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
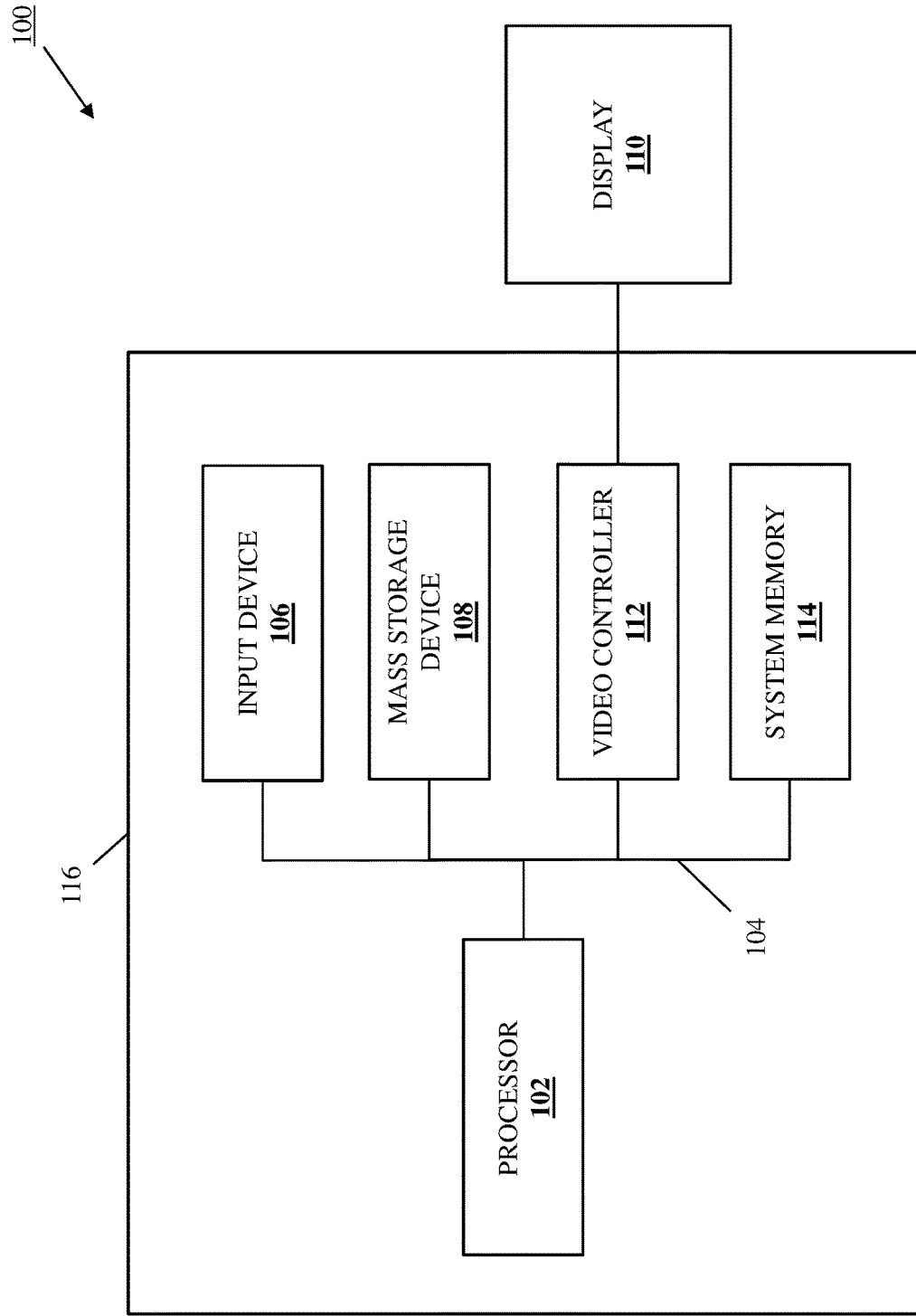
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard disks, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
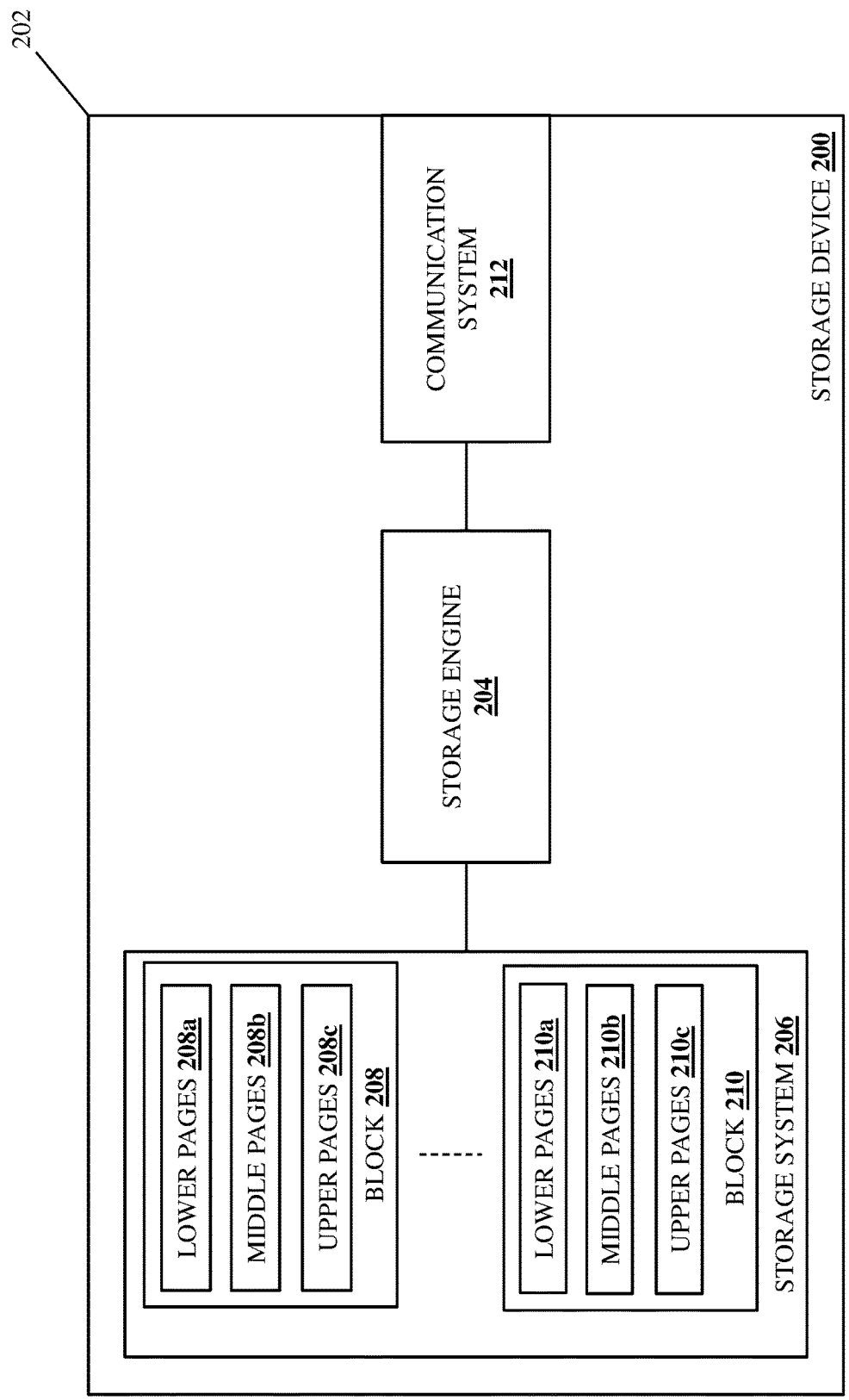
FIG. 2 is a schematic view illustrating an embodiment of a storage device including a storage system that may be tested using the temperature-accelerated solid-state storage testing methods of the present disclosure.

Referring now to FIG. 2, an embodiment of a storage device 200 is illustrated that may include storage systems tested according to the temperature-accelerated solid-state storage testing methods of the present disclosure. In an embodiment, the storage device 200 may be provided in the IHS 100 discussed above with reference to FIG. 1 (e.g., as the mass storage device 108), and in specific examples is described below as being provided by a Solid-State Drive (SSD) storage device. However, while illustrated and discussed as being provided in a particular device, one of skill in the art in possession of the present disclosure will recognize that the temperature-accelerated solid-state storage testing methods of the present disclosure discussed below may be utilized with any of a variety of solid-state storage systems while remaining within the scope of the present disclosure. In the illustrated embodiment, the storage device 200 includes a chassis 202 that houses the components of the storage device 200, only some of which are illustrated and discussed below. For example, the chassis 202 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a storage engine 204 that is configured to perform any of a variety of functionality of storage engines 204 and/or storage devices that would be apparent to one of skill in the art in possession of the present disclosure.

The chassis 202 may also house a storage system 206 that is coupled to the storage engine 204 (e.g., via a coupling between the storage system 206 and the processing system) and that, in the illustrated embodiment, includes a plurality of blocks 208 and up to 210, with the block 208 including lower pages 208a, middle pages 208b, and upper pages 208c, and the block 210 including lower pages 210a, middle pages 210b, and upper pages 210c. As will be appreciated by one of skill in the art in possession of the present disclosure, the embodiment of the storage system 206 illustrated in FIG. 2 may be provided by a NAND storage system including NAND blocks that are configured to store data at 3 bits/ NAND memory cell (e.g., using Triple-Level Cell (TLC) technology), with each NAND memory cell including a respective set of the lower page/middle page/upper page described above.

As such, while many of the discussions in the examples below refer to a single lower page, middle page, and upper page, one of skill in the art in possession of the present disclosure will recognize that each block has multiple lower pages, middle pages, and upper pages, with the respective activation energies (Ea) for each lower page within a block being the same or substantially similar, the respective activation energies (Ea) for each middle page within a block being the same or substantially similar, and the respective activation energies (Ea) for each upper page within a block being the same or substantially similar. Furthermore, while a specific example is provided above and used in the examples below, one of skill in the art in possession of the present disclosure will appreciate how different storage technologies (e.g., memory cells that store fewer bits, memory cells that store more bits (e.g., using Quad-Level Cell (QLC) technologies), etc.) will benefit from the teaching of the present disclosure as well, and thus are envisioned as falling within its scope.

Furthermore, while the storage system 206 is illustrated as included in the storage device 200 (e.g., an SSD storage device as described above), one of skill in the art in possession of the present disclosure will appreciate how the storage system 206 and/or its components (e.g., NAND devices) will be tested separately from the storage device 200 during the temperature-accelerated solid-state storage testing methods discussed below. For example, testing of the storage system 206 or its components may include connecting NAND devices included therein to a testing board that is configured to enable the functionality described below. As such, the illustration of the storage system 206 within the chassis 202 of the storage device 200 is provided to give context to the final use of storage systems that may be tested according to the teachings of the present disclosure, and not meant to imply any requirement that such storage systems must be provided in the chassis of a storage device prior to their testing.

The chassis 202 may also house a communication system 212 that is coupled to the storage engine 204 (e.g., via a coupling between the communication system 212 and the processing system) and that may be provided by any of a variety of storage device communication components that would be apparent to one of skill in the art in possession of the present disclosure. However, while a specific storage device 200 has been illustrated and described, one of skill in the art in possession of the present disclosure will recognize that storage devices may include a variety of components and/or component configurations for providing conventional storage device functionality while remaining within the scope of the present disclosure as well.

Figure 3:
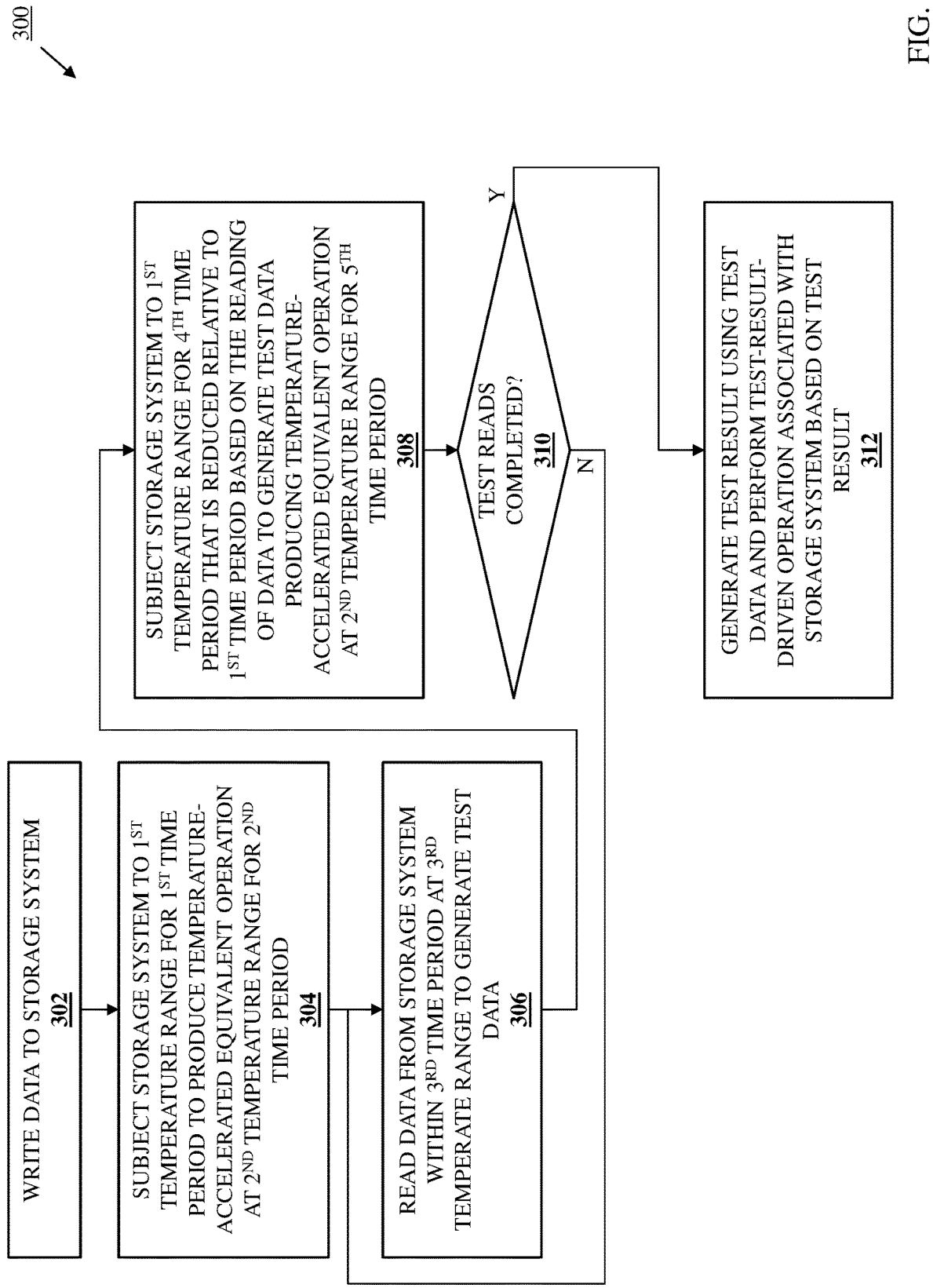
FIG. 3 is a flow chart illustrating an embodiment of a method for temperature-accelerated solid-state storage testing.

Referring now to FIG. 3, an embodiment of a temperature-accelerated solid-state storage testing method 300 is illustrated. As discussed below, some of the methods of the present disclosure provide for a reduction of "bake" times for storage systems under test based on temperature-accelerated operation that is introduced in the storage system during test read operations that are performed to generate test data. For example, the temperature-accelerated solid-state storage testing method of the present disclosure may include writing data to a storage system and subjecting the storage system to an elevated/first temperature range for a first time period that is equivalent to operation at a lower/second temperature for a greater/second time period. Subsequently, the data from the storage system is read within a third time period at a third temperature range to generate first test data. The storage system is then subjected to the elevated/first temperature range for a fourth time period that was reduced relative to the first time period based on the reading of the data to generate the first test data causing the operation of storage system to be equivalent to operating at the lower/second temperature range for a fifth time period. Subsequently the data from the storage system is read within the third time period at the third temperature range to generate second test data. The inventors of the present disclosure have discovered that more accurate data retention test results may be realized when data retention degradation introduced in storage systems during test read operations is used to adjust the "bake" times for those storage systems.

The method 300 begins at block 302 where data is written to a storage system. As discussed above, during or prior to the method 300, a storage system (e.g., a storage system similar to the storage system 206 discussed above with reference to FIG. 2), storage system components, and/or other storage devices may be provided on a testing board that is configured to enable the testing functionality discussed below. To provide a specific example, NAND devices that provide the storage functionality for SSD storage devices may be connected to a testing board that is configured to allow the performance of the write operations and read operations on the NAND devices as discussed below, while also allowing those NAND devices to be subjected to the elevated temperatures (e.g., during "bake" operations) either by placing the testing board in an "oven" or other temperature controlled environment, or allowing those NAND devices to be disconnected form the testing board so that they may be placed in the "oven" or other temperature controlled environment. Furthermore, while not discussed herein in detail, one of skill in the art in possession of the present disclosure will appreciate how the NAND devices may also be subjected to write/erase cycles prior to the testing described below, with those write/erase cycles providing for the repetitive writing and erasing of data to and from the NAND devices in order to provide the NAND devices at different points in a typical storage system lifetime (i.e., after different numbers of write/erase cycles that are associated with different points in the life of those NAND devices). However, while a specific example is provided, one of skill in the art in possession of the present disclosure will appreciate how storage systems may be subject to the operations/method blocks discussed below in a variety of manners that will fall within the scope of the present disclosure as well.

In an embodiment, at block 302, data is written to the storage system via the testing board discussed above. To provide a specific example, a testing computing device may be connected to the testing board and used to write the data via that testing board to the storage system, although other data writing techniques are envisioned as falling within the scope of the present disclosure as well. For the purposes of clarity in the simplified example provided below, the writing of data to the storage system at block 302 is illustrated and described as the writing of data to a lower page (LP) in a block of the storage system. However, one of skill in the art in possession of the present disclosure will appreciate how data may be written to any or all of the pages in any of all of the blocks in the storage system while remaining within the scope of the present disclosure as well. Furthermore, one of skill in the art in possession of the present disclosure will recognize that some NAND storage systems write multiple pages in the same operation, while some NAND storage systems write pages in a combination of operations, and either will fall within the scope of the present disclosure.

Furthermore, one of skill in the art in possession of the present disclosure will recognize how the data written to the storage system at block 302 may include any data that is configured to be read back from the storage system as discussed below in order to generate test data that is indicative of the data retention capabilities of the storage system under test, with the specific example provided below identifying errors in the data read from the storage system during testing as compared to the data that was written to that storage system at block 302. As such, any of a variety of known/predetermined/testing data patterns may be written to the storage system at block 302, and then used to determine how many errors are present in that data that is subsequently read from the storage system as discussed in further detail below.

The method 300 then proceeds to block 304 where the storage system is subject to a first temperature range for a first time period to produce temperature-accelerated equivalent operation at a second temperature range for a second time period. In an embodiment, at block 304 and following the writing of the data to the storage system at block 302, the storage system may be subjected to "bake" operations by, for example, providing that storage system in an "oven" in order to elevate the temperature of the storage system to a first temperature range for a "bake" time that provides the first time period.

As discussed above, analog voltages stored in solid-state NAND storage systems may be impacted by physical mechanisms that are accelerated at increased temperature, and an Arrhenius relationship may be used to represent that temperature acceleration. As will be appreciated by one of skill in the art in possession of the present disclosure, the Arrhenius relationship discussed above may define an activation energy (Ea) that governs how temperature accelerates data retention mechanisms in a storage system, and can be used to determine a testing temperature range/duration that achieves a desired testing result in a reduced time period. For example, the following equations may be used to determine how a data retention testing duration may be accelerated via an elevated temperature:

$$Result_1 = exp^{(-Ea/k \ast 1/temp1)} \ast time_1$$

$$Result_2 = exp^{(-Ea/k \ast 1/temp2)} \ast time_2$$

$$AF_{1\_2} = exp^{(-Ea/k \ast 1/temp1)} / (-Ea/k \ast 1/temp2) = exp^{[-Ea/k \ast (1/temp1 - 1/temp2)]}$$

To provide a specific example, considering an activation energy (Ea) of 1.1 (a common value suggested by the JEDEC Solid State Technology Association), an elevated temperature ($temp_1$) of 85 degrees Celsius (85 C), and a base temperature ($temp_2$) of 40 C, $AF_{1\_2}$ will be 168 days. As such, a data retention test duration of 365 days (1 year) at 40 C will provide a data retention test result that may also be achieved in 2.17 days (365/168) at 85 C. However, one of skill in the art in possession of the present disclosure will appreciate how the 1.1 Ea value recommended by the JEDEC Solid State Technology Association does not fit all cases, and activation energies may also be provided by NAND storage system vendors, based on testing, or in other manners while remaining within the scope of the present disclosure.

With reference to FIG. 4, a conventional temperature-accelerated solid-state storage testing schedule 400 is illustrated for comparison to the temperature-accelerated solid-state storage testing schedules of the present disclosure, and provides "bake" times for a lower page (LP) in a storage system with an activation energy (Ea) of 1.0 based on the temperature acceleration discussed above. As can be seen, step 1 of the conventional temperature-accelerated solid-state storage testing schedule 400 provides the storage system at an elevated temperature of 85 C for 6.9 hours to produce an equivalent operating time for the storage system of 30.0 days at 40 C. Similarly, step 2 of the conventional temperature-accelerated solid-state storage testing schedule 400 provides the storage system at an elevated temperature of 85 C for 13.7 hours to produce an equivalent operating time for the storage system of 60.0 days at 40 C, and one of skill in the art in possession of the present disclosure will appreciate that the step 1-4 of the conventional temperature-accelerated solid-state storage testing schedule 400 provides a respective "bake" time of 6.8-6.9 hours to produce corresponding equivalent operating times for the storage system of 30.0 days at 40 C (with steps 5 and 6 in the conventional temperature-accelerated solid-state storage testing schedule 400 of FIG. 4 illustrating extended "bake" times to illustrate equivalent operating times for the storage system of 60.0 days at 40 C following step 4, and 185.0 days at 40 C following step 5, respectively).

However, as discussed in further detail below, the testing of the storage system also includes reading the data that was written to the storage system as part of each step and following each "bake" operation, and the inventors of the present disclosure have discovered that such reads may produce data retention degradation such that the "bake" times identified in the conventional temperature-accelerated solid-state storage testing schedule 400 result in inaccurate test data from the reads of the storage system discussed above. For example, FIG. 5A provides a temperature-accelerated solid-state storage testing schedule 500 that illustrates how read scan operations may produce data retention degradation in the storage system, with the specific example in the illustrated embodiment showing how a read scan operation performed following each step 1-6 for 6.0 hours at 55 C will produce an equivalent operating time for the storage system of 1.4 days at 40 C. As such, the temperature-accelerated solid-state storage testing schedule 500 illustrates how the "bake" times at each step 1-6 are each followed by a 6.0 hour read scan operation that produces an "additional" equivalent operating time for the storage system of 1.4 days at 40 C.

As will be appreciated by one of skill in the art in possession of the present disclosure, the "additional" equivalent operating times for the storage system that are produced in response to the read scan operations performed for 6.0 hours at 55 C may be substantially reduced or eliminated by performing such read scan operations at a substantially reduced temperature. For example, the performance of read scan operations for 6.0 hours at 25 C may not result in appreciable/significant "additional" equivalent operating times for the storage system. However, one of skill in the art in possession of the present disclosure will appreciate that the performance of read scan operations at 25 C does not represent the conditions present in many actual storage system deployments/use cases, and thus will provide less accurate test results compared to the performance of read scan operations at 55 C, which is a typical/average operating temperature for a solid-state storage system and more accurately simulates actual/real-world customer environments to provide more accurate test results. However, while the examples herein discuss performing read scan operations at 55 C, one of skill in the art in possession of the present disclosure will appreciate that benefits of the teachings of the present disclosure may be realized when performing read scan operations at other temperatures as well.

Thus, as illustrated in FIG. 5A, the 6.9 hour "bake" time at 85 C in step 1 will produce an equivalent operating time for the storage system of 30.0 days at 40 C, and the immediately subsequent 6.0 hour read scan operation at 55 C in step 1 will produce an equivalent operating time for the storage system of 1.4 days at 40 C, thus resulting an "actual" equivalent operating time for the storage system of 31.4 days at 40 C following step 1. Similarly, the 6.8 hour "bake" time at 85 C in step 2 following step 1 will produce an equivalent operating time for the storage system of 60.0 days at 40 C, and the immediately subsequent 6.0 hour read scan operation at 55 C in step 2 will produce an equivalent operating time for the storage system of 1.4 days at 40 C, thus resulting an "actual" equivalent operating time for the storage system of 62.8 days at 40 C following step 2. As illustrated in FIG. 5B, a read-scan-compensated temperature-accelerated solid-state storage testing schedule 502 may be generated based on "additional" equivalent operating times introduced by the read scan operations discussed above, and may include modified "bake" times (e.g., the "bake" times identified in steps 2-6 in FIG. 5B) that take into account those "additional" equivalent operating times such that the read scan operations at each step are performed on the storage system at the desired equivalent operating times of 30.0 days, 60.0 days, 90.0 days, 120.0 days, 180.0 days, and 365.0 days.

As such, in an embodiment of block 304 that utilizes step 1 of the read-scan-compensated temperature-accelerated solid-state storage testing schedule 502 of FIG. 5B, the storage system is subject to a first temperature range (e.g., ~85 C) for a first time period (~6.9 hours) to produce temperature-accelerated equivalent operation at a second temperature range (e.g., ~40 C) for a second time period (~30.0 days). As will be appreciated by one of skill in the art in possession of the present disclosure, while specific values are provided for the first temperature range, first time period, second temperature range, and second time period, those values may fluctuate within testing thresholds while remaining within the scope of the present disclosure. Furthermore, the benefits of the present disclosure may be realized for other temperatures and time periods. For example, the first temperature range discussed above may be between 70 C and 90 C, the first time period may be between 6 hours and 8 hours, the second temperature range may be between 35 C and 45 C, and the second time period may be between 25.0 days and 35.0 days. However, while specific temperature ranges and time periods are provided, one of skill in the art in possession of the present disclosure will recognize that temperatures and times may fall outside of the ranges provided above while still providing the benefits of the present disclosure, and thus are envisioned as falling within its scope.

The method 300 then proceeds to block 306 where data is read from the storage system within a third time period at a third temperature range to generate test data. In an embodiment of block 306 that utilizes step 1 of the read-scan-compensated temperature-accelerated solid-state storage testing schedule 502 of FIG. 5B, the data written to the storage system at block 302 is read from the storage system within a third time period (e.g., ~6.0 hours) at a third temperature range (e.g., ~55 C) to generate test data. As will be appreciated by one of skill in the art in possession of the present disclosure, at block 306, the temperature of the storage system may be reduced from 85C to 55C (e.g., by reducing the temperature of the "oven" or other temperature controlled environment, by removing the storage system from the "oven" or other temperature controlled environment, etc.), and the testing computing device connected to the testing board may be utilized to read the data from the storage system, which one of skill in the art in possession of the present disclosure will recognize generates "test" data for the lower page (LP) l the storage system that may include one or more errors relative to the data that was written to the lower page (LP) in the storage system at block 302.

As illustrated in FIG. 5B, the read scan operations that are performed during step 1 of the read-scan-compensated temperature-accelerated solid-state storage testing schedule 502 and on the storage system within the third time period (e.g., ~6.0 hours) at the third temperature range (e.g., ~55 C) to generate the test data will cause the operation of storage system to be equivalent to operating at the second temperature range (e.g., ~40 C) for a fifth time period (e.g., ~1.4 days). As will be appreciated by one of skill in the art in possession of the present disclosure, while specific values are provided for the third temperature range, third time period, second temperature range, and fifth time period, those values may fluctuate within testing thresholds while remaining within the scope of the present disclosure. Furthermore, the benefits of the present disclosure may be realized for other temperatures and time periods. For example, the third time period discussed above may be 7.0 hours, the third temperature range discussed above may be between 35 C and 70 C, the second temperature range may be between 35 C and 45 C, and the fifth time period may be between 1.0 day and 2.0 days. However, while specific temperature ranges and time periods are provided, one of skill in the art in possession of the present disclosure will recognize that that temperatures and times may fall outside of the ranges provided above while still providing the benefits the benefits of the present disclosure, and thus are envisioned as falling within its scope.

The method 300 then proceeds to block 308 where the storage system is subject to the first temperature range for a fourth time period that is reduced relative to the first time period based on the reading of the data to generate the test data producing temperature-accelerated equivalent operation at the second temperature range for a fifth time period. In an embodiment of block 308 that utilizes step 2 of the read-scan-compensated temperature-accelerated solid-state storage testing schedule 502 of FIG. 5B, the storage system is subject to the first temperature range (e.g., ~85 C) for a fourth time period (~6.5 hours to produce the ~13.4 hour "bake" time identified in step 2 following the ~6.9 hour "bake" time identified in step 1) that is reduced relative to the first time period (~6.9 hours) based on the reading of the data to generate the test data producing temperature-accelerated equivalent operation at the second temperature range (~40 C) for a fifth time period (~1.4 days). As will be appreciated by one of skill in the art in possession of the present disclosure, while specific values are provided for the first temperature range, fourth time period, first time period, second temperature range, and fifth time period, those values may fluctuate within testing thresholds while remaining within the scope of the present disclosure. Furthermore, the benefits of the present disclosure may be realized for other temperatures and time periods. For example, the first temperature range discussed above may be between 70 C and 90 C, the fourth time period may be between 6 hours and 8 hours, the first time period may be between 6 hours and 8 hours (while being greater than the fourth time period), the second temperature range may be between 35 C and 45 C, and the fifth time period may be between 1.0 day and 2.0 days. However, while specific temperature ranges and time periods are provided, one of skill in the art in possession of the present disclosure will recognize that some temperatures and times may fall outside of the ranges provided above while still providing the benefits of the present disclosure, and thus are envisioned as falling within its scope.

The method 300 then proceeds to decision block 310 where the method 300 proceeds depending on whether the test reads have been completed. As will be appreciated by one of skill in the art in possession of the present disclosure, the method 300 may continue until the storage system is tested fully according to the entire read-scan-compensated temperature-accelerated solid-state storage testing schedule 502 of FIG. 5B, which includes performing all the "bake" operations and read scan operations identified therein. As such, if at decision block 306 the test reads have not been completed, the method 300 returns to block 306.

In an embodiment of a second iteration of block 306 that utilizes step 2 of the read-scan-compensated temperature-accelerated solid-state storage testing schedule 502 of FIG. 5B, the data written to the storage system at block 302 is again read from the storage system within the third time period (e.g., ~6.0 hours) at the third temperature range (e.g., ~55 C) to generate test data, similarly as discussed above for the first iteration of block 306. As illustrated in FIG. 5B, the read scan operations performed during step 2 of the read-scan-compensated temperature-accelerated solid-state storage testing schedule 502 from the storage system within the third time period (e.g., ~6.0 hours) at the third temperature range (e.g., ~55 C) to generate test data will again cause the operation of storage system to be equivalent to operating at the second temperature range (e.g., ~40 C) for the fifth time period (e.g., ~1.4 days).

The method 300 then proceeds to a second iteration of block 308 where the storage system is subject to the first temperature range for the fourth time period that is reduced relative to the first time period based on the reading of the data to generate the test data producing temperature-accelerated equivalent operation at the second temperature range for the fifth time period. Continuing with the embodiment of the second iteration of block 308 that utilizes step 3 of the read-scan-compensated temperature-accelerated solid-state storage testing schedule 502 of FIG. 5B, the storage system is again subject to the first temperature range (e.g., ~85 C) for the fourth time period (~6.4 hours to produce the ~19.8 hour "bake" time identified in step 3 following the ~6.9 hour "bake" time identified in step 1 and the ~6.5 hour "bake" time performed at step 2 as discussed above) that is reduced relative to the first time period (~6.9 hours) based on the reading of the data to generate the test data producing temperature-accelerated equivalent operation at the second temperature range (~40 C) for a fifth time period (~1.4 days).

As such, the method 300 may loop through blocks 306, 308, and 310 such that each of the "bake" operations and read scan operations identified in steps 3-6 of the read-scan-compensated temperature-accelerated solid-state storage testing schedule 502 of FIG. 5B are performed. Thus, one of skill in the art in possession of the present disclosure will appreciate how the method 300 provides for the reduction of "bake" times (e.g., following the first "bake" operations) in order to compensate for the data retention degradation that is introduced by each read scan operation that is performed following a corresponding "bake" operation, thus ensuring that each read scan operation is performed on the storage system when that storage system has been provided with desired equivalent operating times (e.g., ~30.0 days, ~60.0 days, ~90.0 days, ~120.0 days, ~180.0 days, and 365.0 days in the simplified examples provided herein).

Figure 10:
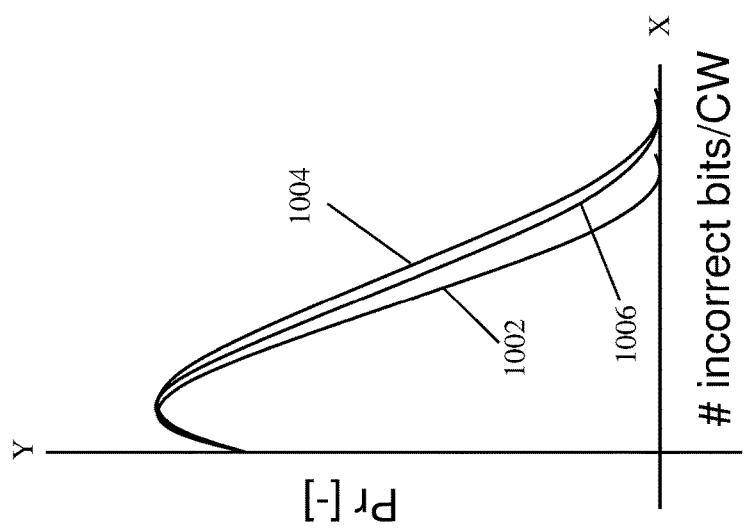
FIG. 10 is a graph view illustrating an embodiment of a testing result achieved during the methods of FIG. 4, FIGS. 6A and 6B, or FIG. 9.
Figure 11:
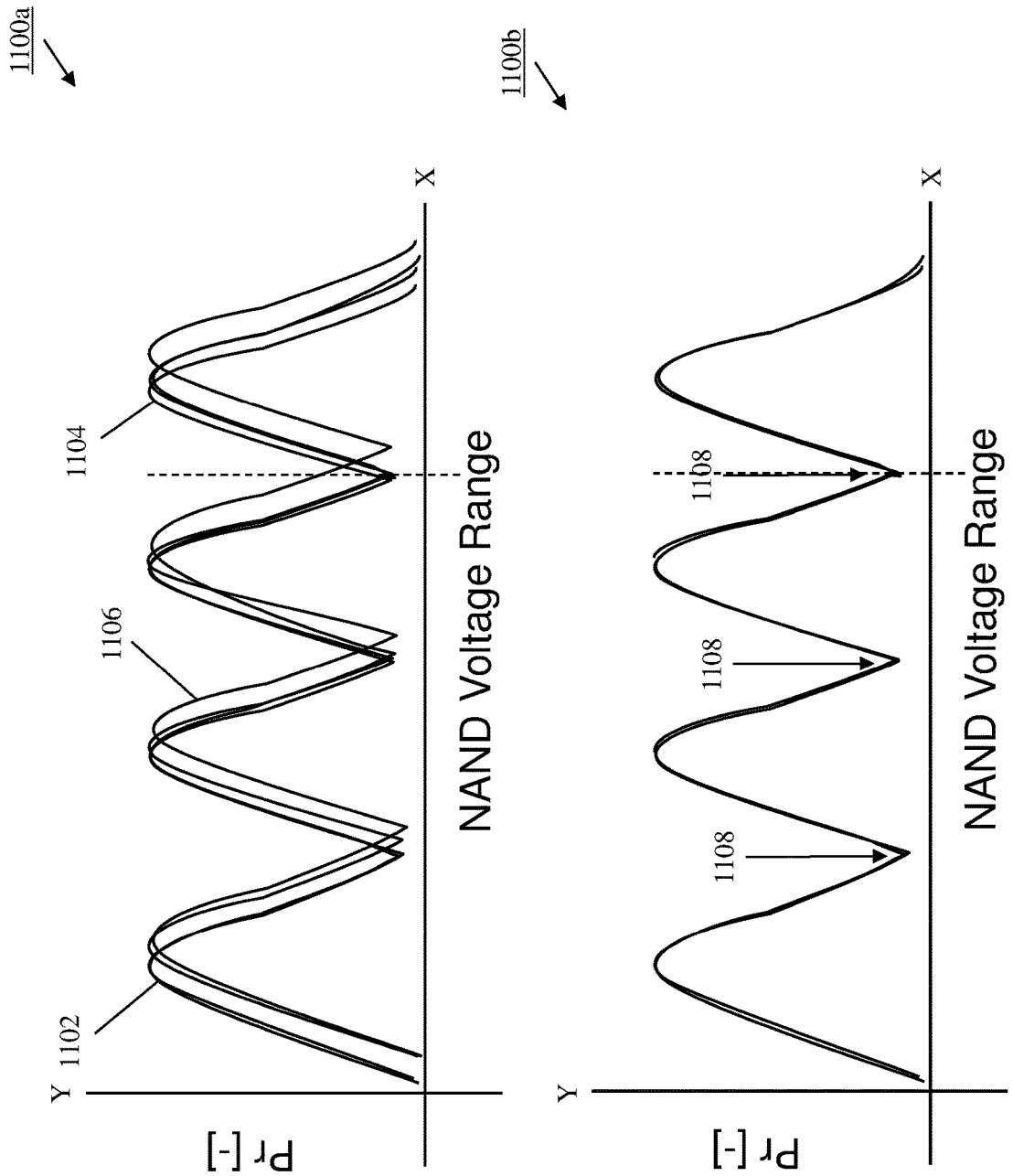
FIG. 11 is a graph view illustrating an embodiment of a testing result achieved during the methods of FIG. 4, FIGS. 6A and 6B, or FIG. 9.

If at decision block 306, the test reads have been completed, the method 300 proceeds to block 312 where a test result is generated using the test data, and a test-result-driven operation associated with the storage system is performed based on the test result. In an embodiment, at block 312 and following the completion of the "bake" operations and read scan operations identified in the read-scan-compensated temperature-accelerated solid-state storage testing schedule 502 of FIG. 5B, the testing computing device discussed above that generated the test data via the read scan operations performed following each "bake" operation at the iterations of block 306 will operate to use that test data to generate a test result. FIGS. 10 and 11 illustrate embodiments of test results that may be generated using test data produced via the methods described herein, and are described in further detail below. Furthermore, at block 312, the testing computing device may perform test-result-driven operations associated with the storage system based on the test result, which as discussed below with reference to FIGS. 10 and 11 may include utilizing the test result to provide for the configuration of solid-state storage systems in a manner that minimizes errors in data stored therein, ensure that errors included in data read from solid-state storage systems during their lifetime are at acceptable levels, and/or perform other testing-result-driven operations known in the art.

Thus, systems and methods have been described that provide for a reduction of "bake" times for storage systems under test based on temperature-accelerated operation that is introduced in the storage system during test read operations that are performed to generate test data. For example, the temperature-accelerated solid-state storage testing method of the present disclosure may include writing data to a storage system and subjecting the storage system to an elevated/first temperature range for a first time period that is equivalent to operation at a lower/second temperature for a greater/second time period. Subsequently, the data from the storage system is read within a third time period at a third temperature range to generate first test data. The storage system is then subjected to the elevated/first temperature range for a fourth time period that was reduced relative to the first time period based on the reading of the data to generate the first test data causing the operation of storage system to be equivalent to operating at the lower/second temperature range for a fifth time period. Subsequently the data from the storage system is read within the third time period at the third temperature range to generate second test data. As such, more accurate data retention test results may be realized by using data retention degradation introduced in storage systems during test read operations to adjust the "bake" times for those storage systems.

Figure 6A:
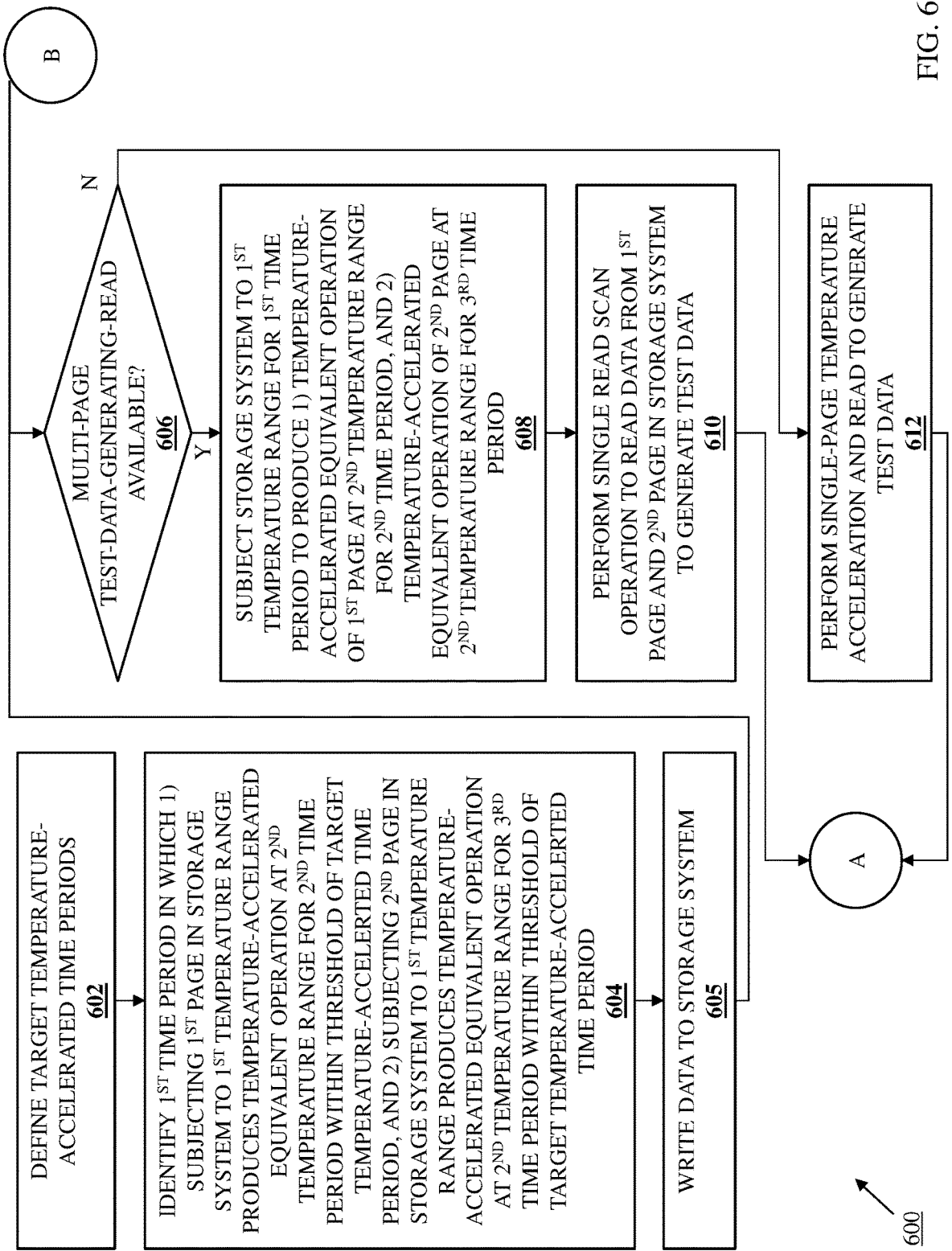
FIG. 6A is a flow chart illustrating an embodiment of a portion of a method for temperature-accelerated solid-state storage testing.
Figure 6B:
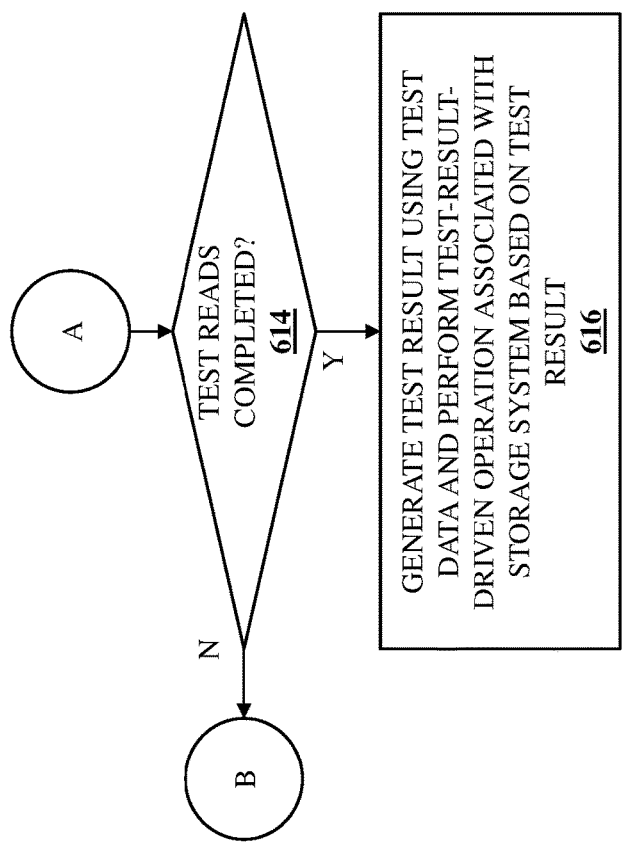
FIG. 6B is a flow chart illustrating an embodiment of a portion of the method for temperature-accelerated solid-state storage testing of FIG. 6A.

Referring now to FIGS. 6A and 6B, an embodiment of a temperature-accelerated solid-state storage testing method 600 is illustrated. As discussed below, the systems and methods of the present disclosure provide for identification of a first temperature range that produces temperature-accelerated equivalent operation of different pages in a storage system at a second temperature range for respective time periods that are within a target-temperature accelerated time period, and the use of the first temperature range to temperature-accelerate the operation of those different pages to allow a single read scan operation on the storage system to generate test data from both those different pages. For example, the temperature-accelerated solid-state storage testing method of the present disclosure may include defining a target temperature-accelerated time period, and identifying a first time period at which 1) subjecting a first page in a storage system to a first temperature range will cause the operation of the first page in the storage system to be equivalent to operating at a second temperature range that is less than the first temperature range and for a second time period that is within a threshold of the target temperature-accelerated time period, and 2) subjecting a second page in the storage system to the first temperature range will cause the operation of the second page in the storage system to be equivalent to operating at the second temperature range for a third time period that is within the threshold of the target temperature-accelerated time period.

Data is then written to the first page and the second page in the storage system, and the storage system is subjected to the first temperature range for the first time period in order to 1) cause the operation of the first page in the storage system to be equivalent to operating at the second temperature range for the second time period, and 2) cause the operation of the second page in the storage system to be equivalent to operating at the second temperature range for the third time period. The data in the first page and the second page in the storage system is then read subsequent to the first time period using a single read scan operation in order to generate first test data. As such, storage systems may be tested while minimizing read scan operations that can interfere with test results, thus providing for more accurate testing of the storage systems.

The method 600 begins at block 602 where target temperature-accelerated time periods are defined. In an embodiment, at block 602, target temperature-accelerated time periods may be defined that provide the amount of equivalent operating times that will be produced in the storage system using temperature acceleration (e.g., by providing that storage device at an elevated temperature), and that identify when testing of the storage system should be performed. As such, each "bake" operation performed during the method 600 will attempt to add an equivalent operating time that is within a threshold of a target temperature-accelerated time period to the storage system. Furthermore, while a particular target temperature-accelerated time periods of ~30.0 days, ~60.0 days, ~90.0 days, and ~120.0 days, and a threshold of 10%, are utilized throughout the present disclosure, one of skill in the art in possession of the present disclosure will appreciate how other target temperature-accelerated time periods and thresholds may be defined that will fall within the scope of the present disclosure as well.

The method 600 then proceeds to block 604 where a first time period is identified in which 1) subjecting a first page in a storage system to a first temperature range produces temperature-accelerated equivalent operation at a second temperature range for a second time period that is within a threshold of the target temperature-accelerated time period, and 2) subjecting a second page in the storage system to the first temperature range produces temperature-accelerated equivalent operation at the second temperature range for a third time period that is within a threshold of the target temperature-accelerated time period. As will be appreciated by one of skill in the art in possession of the present disclosure, the operations at block 604 may be based on the Arrhenius relationship equations discussed above that identify how testing duration may be accelerated via an elevated temperature.

With reference to FIG. 7, a conventional temperature-accelerated solid-state storage testing schedule 700 is illustrated for comparison to the temperature-accelerated solid-state storage testing schedules of the present disclosure, and provides "bake" times for a lower page (LP) in a storage system with an activation energy (Ea) of 1.0 based on the temperature acceleration discussed above, a middle page (MP) in a storage system with an activation energy (Ea) of 0.97 based on the temperature acceleration discussed above, and an upper page (UP) in a storage system with an activation energy (Ea) of 0.94 based on the temperature acceleration discussed above. As will be appreciated by one of skill in the art in possession of the present disclosure, NAND cells that store relatively higher voltages are more likely to lose at least some of that voltage, and thus such NAND cells (e.g., the upper page NAND cells in one example) will have lower activation energies relative to other NAND cells (e.g., the lower page NAND cells in one example). As can be seen, step 1 of the conventional temperature-accelerated solid-state storage testing schedule 700 provides the storage system at an elevated temperature of 85 C for 6.9 hours to produce an equivalent operating time for the lower page (LP) in the storage system of 30.0 days at 40 C, while producing an equivalent operating time for the middle page (MP) in the storage system of 26.1 days at 40 C, and producing an equivalent operating time for the upper page (UP) in the storage system of 22.7 days at 40 C.

Similarly, step 2 of the conventional temperature-accelerated solid-state storage testing schedule 700 provides the storage system at an elevated temperature of 85 C for 7.9 hours to produce an equivalent operating time for the lower page (LP) in the storage system of 34.6 days at 40 C, while producing an equivalent operating time for the middle page (MP) in the storage system of 30.0 days at 40 C, and producing an equivalent operating time for the upper page (UP) in the storage system of 26.1 days at 40 C. Similarly, step 3 of the conventional temperature-accelerated solid-state storage testing schedule 700 provides the storage system at an elevated temperature of 85 C for 9.1 hours to produce an equivalent operating time for the lower page (LP) in the storage system of 39.7 days at 40 C, while producing an equivalent operating time for the middle page (MP) in the storage system of 34.5 days at 40 C, and producing an equivalent operating time for the upper page (UP) in the storage system of 30.0 days at 40 C.

As will be appreciated by one of skill in the art in possession of the present disclosure, each step 1, 2, and 3 in the conventional temperature-accelerated solid-state storage testing schedule 700 may be followed by a read scan operation that reads data that is written to the lower page, middle page, and upper page in the storage system, but each of those read scan operations will only generate test data for the one of the lower page, middle page, and upper page in the storage system that is currently at the target temperature-accelerated time period (e.g., ~30.0 days in this example). As such, the read scan operation at step 1 will generate test data from the data read from the lower page of the storage system that has an equivalent operating time of ~30.0 days, while the data read from the middle page and upper page of the storage system will be discarded or otherwise not used (i.e., due to those pages not currently being at the target temperature-accelerated time period). Similarly, the read scan operation at step 2 will generate test data from the data read from the middle page of the storage system that has an equivalent operating time of ~30.0 days, while the data read from the lower page and upper page of the storage system will be discarded or otherwise not used (i.e., due to those pages not currently being at the target temperature-accelerated time period), and the read scan operation at step 3 will generate test data from the data read from the upper page of the storage system that has an equivalent operating time of ~30.0 days, while the data read from the lower page and middle page of the storage system will be discarded or otherwise not used (i.e., due to those pages not currently being at the target temperature-accelerated time period).

One of skill in the art in possession of the present disclosure will appreciate that the conventional temperature-accelerated solid-state storage testing schedule 400 provides for the performance of similar "bake" operations and read scan operations to generate test data for each of the lower page, middle page, and upper page in the storage system when those pages have equivalent operating times of ~60.0 days, ~90.0 days, and ~120.0 days, with the conventional temperature-accelerated solid-state storage testing schedule 400 requiring a respective read scan operation to generate test data for each page due to each page reaching the target temperature-accelerated time periods after different "bake" times (e.g., after 6.9 hours for the lower page in the storage system, after 7.9 hours for the middle page in the storage system, after 9.1 hours for the upper page in the storage system, and so on).

As will be appreciated by one of skill in the art in possession of the present disclosure, solid-state storage systems such as the NAND storage systems discussed above are susceptible to a phenomenon called the "read disturb" effect, whereby a "pass voltage" that is applied during read operations to "read-adjacent" layers (e.g., layers which are adjacent to the layer of NAND gates connected to the voltage measurement circuitry) are "micro-programmed", with successive reads having a cumulative "micro-programming" effect that builds up voltage in the "read-adjacent" layers. Furthermore, one of skill in the art in possession of the present disclosure will appreciate how the read-disturb effect has an opposite effect on NAND storage systems compared to the data retention affects that are being measured during the testing described herein and that allow voltage loss from the NAND storage system, and is difficult to quantify. To provide a specific example, data retention testing for a NAND storage system may require up to 36 read scan operations (e.g., 12 retention point read scan operations per page*3 pages) that will produce a non-negligible read disturb effect on that NAND storage system. As such, the inventors of the present disclosure have developed techniques for reducing the number of read operations during testing, thus reducing the read disturb effect generated during testing and allowing for more accurate identification of the data retention effects discussed above.

With reference to FIG. 8, in an embodiment of block 604, a temperature-accelerated solid-state storage testing schedule 800 may be generated. As can be seen in step 1 of the temperature-accelerated solid-state storage testing schedule 800 of FIG. 8, a first time period (e.g., ~7.4 hours) may be identified in which 1) subjecting a first page (e.g., the lower page (LP)) in a storage system to a first temperature range (e.g., ~85 C) produces temperature-accelerated equivalent operation at a second temperature range (e.g., ~40 C) for a second time period (e.g., ~32.4 days) that is within a threshold (e.g., ~10%) of the target temperature-accelerated time period (e.g., ~30.0 days), and 2) subjecting a second page (the middle page (MP)) in the storage system to the first temperature range (e.g., ~85 C) produces temperature-accelerated equivalent operation at the second temperature range (e.g., ~40 C) for a third time period (e.g., ~28.2 days) that is within the threshold (10%) of the target temperature-accelerated time period (e.g., ~30.0 days). As such, the temperature-accelerated solid-state storage testing schedule 800 may have been generated by identifying the first time period (e.g., ~7.4 hours) that produced equivalent operating times (e.g., ~32.4 days and ~28.2 days) for the lower page (LP) and middle page (MP) in the storage system that were within the threshold (e.g., 10% or 3.0 days) of the target temperature-accelerated time period (e.g., ~30.0 days).

As will be appreciated by one of skill in the art in possession of the present disclosure, the "bake" time that produces an equivalent operating time that is within the threshold of the target temperature-accelerated time period for a particular page in the storage system may not produce an equivalent operating time that is within the threshold of the target temperature-accelerated time period for any other pages in the storage system. For example, step 2 of the temperature-accelerated solid-state storage testing schedule 800 of FIG. 8 illustrates how a "bake" time of ~9.1 hours produces an equivalent operating time of 30.0 days for the upper page (UP) in the storage system, but does not produce an equivalent operating time that is within the threshold of the target temperature-accelerated time period for the lower page or upper page in the storage system. As such, in order to obtain test data from the upper page in the storage system at (or near) the target temperature-accelerated time period, a read scan operation must be performed following the "bake" time of ~9.1 hours. Similar issues occur at steps 4, 7, and 9 in the temperature-accelerated solid-state storage testing schedule 800 of FIG. 8.

However, similar to step 1 and as can be seen in step 3 of the temperature-accelerated solid-state storage testing schedule 800 of FIG. 8, a first time period (e.g., ~14.8 hours) may be identified in which 1) subjecting the first page (e.g., the lower page (LP)) in the storage system to the first temperature range (e.g., ~85 C) produces temperature-accelerated equivalent operation at the second temperature range (e.g., ~40 C) for a second time period (e.g., ~64.9 days) that is within a threshold (e.g., ~10%) of a target temperature-accelerated time period (e.g., ~60.0 days), and 2) subjecting a second page (the middle page (MP)) in the storage system to the first temperature range (e.g., ~85 C) produces temperature-accelerated equivalent operation at the second temperature range (e.g., ~40 C) for a third time period (e.g., ~56.4 days) that is within the threshold (10%) of the target temperature-accelerated time period (e.g., ~60.0 days). As such, temperature-accelerated solid-state storage testing schedule 800 may have been generated by identifying the first time period (e.g., ~14.8 hours) that produced equivalent operating times (e.g., ~64.9 days and ~56.4 days) for the lower page (LP) and middle page (MP) in the storage system that were within the threshold (e.g., 10% or 6.0 days) of the target temperature-accelerated time period (e.g., ~60.0 days).

As such, one of skill in the art in possession of the present disclosure will recognize how the temperature-accelerated solid-state storage testing schedule 800 of FIG. 8 may be generated by identifying "bake" times that produce equivalent operating times for multiple pages in the storage system that are within the threshold of a target temperature-accelerated time period, which as discussed above allows a single read scan operation on the storage system that reads data from each of those multiple pages to generate corresponding test data for each of those pages, thus reducing the number of read scan operations needed to produce test data for each of the pages in the storage system at (or near) each of the target temperature-accelerated time periods.

The method 600 then proceeds to block 605 where data is written to a storage system. Similarly as discussed above, during or prior to the method 600, a storage system (e.g., a storage system similar to the storage system 206 discussed above with reference to FIG. 2), storage system components, and/or other storage devices may be provided on a testing board that is configured to enable the testing functionality discussed below. In an embodiment, at block 605, data is written to the storage system via the testing board discussed above. To provide a specific example, a testing computing device may be connected to the testing board and used to write the data via that testing board to each of the pages in the storage system, although other data writing techniques are envisioned as falling within the scope of the present disclosure as well.

Furthermore, one of skill in the art in possession of the present disclosure will recognize how the data written to the storage system at block 605 may include any data that is configured to be read back from the storage system as discussed below in order to generate test data that is indicative of the data retention capabilities of the storage system under test, with the specific example provided below identifying the number of errors in the data read from the storage system during testing as compared to the data that was written to that storage system at block 605. As such, any of a variety of known/predetermined/testing data patterns may be written to the storage system at block 605, and then used to determine how many errors are present in the data that is subsequently read from the storage system as discussed in further detail below.

The method 600 then proceeds to decision block 606 where the method 600 proceeds depending on whether a multi-page test-data-generating-read is available. As discussed above and in further detail below, temperature-accelerated solid-state storage testing schedules like the temperature-accelerated solid-state storage testing schedule 800 of FIG. 8 allow for a single read scan operation to generate test data from multiple pages in the storage system, but may also require a read scan operation in order to generate test data from a single page in the storage system. As such, if at decision block 606 a multi-page test-data-generating-read is available, the method 600 proceeds to block 608 where the storage system is subjected to the first temperature range for the first time period to produce 1) temperature-accelerated equivalent operation of the first page at the second temperature range for the second time period, and 2) temperature-accelerated equivalent operation of the second page at the second temperature range for the third time period. Similarly as described above, in an embodiment of block 608 and following the writing of the data to the storage system at block 605, the storage system may be subjected to "bake" operations by, for example, providing that storage system in an "oven" in order to elevate the temperature of the storage system to a first temperature range for a "bake" time that provides the first time period.

In an embodiment, at block 608 and with reference back to step 1 of the temperature-accelerated solid-state storage testing schedule 800 of FIG. 8, the storage system is subjected to the first temperature range (e.g., ~85 C) for the first time period (~7.4 hours) to produce 1) temperature-accelerated equivalent operation of the first page (e.g., the lower page (LP) in the storage system) at the second temperature range (e.g., ~40 C) for the second time period (e.g., ~32.4 days), and 2) temperature-accelerated equivalent operation of the second page (e.g., the middle page (MP) in the storage system) at the second temperature range (e.g., 40 C) for the third time period (e.g., ~28.2 days). As can been seen in step 1 of the temperature-accelerated solid-state storage testing schedule 800 of FIG. 8, subjecting the storage system to the first temperature range (e.g., ~85 C) for the first time period (~7.4 hours) will also produce temperature-accelerated equivalent operation of the third page (e.g., the upper page (UP) in the storage system) at the second temperature range (e.g., ~40 C) for the a time period (e.g., ~24.5 days) that is not within the threshold (10%) of the target temperature-accelerated time period (e.g., ~30.0 days).

As will be appreciated by one of skill in the art in possession of the present disclosure, while specific values are provided for the first temperature range and second temperature range, those values may fluctuate within testing thresholds while remaining within the scope of the present disclosure. Furthermore, the benefits of the present disclosure may be realized for other temperatures and time periods. For example, the first temperature range discussed above may be between 70 C and 90 C, and the second temperature range may be between 35 C and 45 C. However, while specific temperature ranges and time periods are provided, one of skill in the art in possession of the present disclosure will recognize that temperatures and times may fall outside of the ranges discussed above while still providing the benefits of the present disclosure, and thus are envisioned as falling within its scope.

The method then proceeds to block 610 where a single read scan operation is performed to read data from the first page and the second page in the storage system to generate test data. In an embodiment, at block 610, the testing computing device connected to the testing board may perform a single read scan operation on the storage system in order to read data from each of the lower page, the middle page, and the upper page in the storage system in order to generate test data for the lower page and the middle page, while discarding the data read from the upper page due to the temperature-accelerated equivalent operation of the upper page at the second temperature range (e.g., ~40 C) for the time period (e.g., ~24.5 days) not being within the threshold (10%) of the target temperature-accelerated time period (e.g., ~30.0 days).

If at decision block 606, a multi-page test-data-generating-read is not available, the method 600 proceeds to block 612 where a single-page temperature acceleration and read is performed to generate test data. In an embodiment, at block 612 and with reference back to step 2 of the temperature-accelerated solid-state storage testing schedule 800 of FIG. 8, the storage system is subjected to the first temperature range (e.g., ~85 C) for the first time period (~9.1 hours) to produce 1) temperature-accelerated equivalent operation of the third page (e.g., the upper page (UP) in the storage system) at the second temperature range (e.g., ~40 C) for a time period (e.g., ~30.0 days) that is within the threshold (10%) of the target temperature-accelerated time period (e.g., ~30.0 days). As can been seen in step 2 of the temperature-accelerated solid-state storage testing schedule 800 of FIG. 8, subjecting the storage system to the first temperature range (e.g., ~85 C) for the first time period (~9.1 hours) will also produce temperature-accelerated equivalent operation of the first page (e.g., the lower page (LP) in the storage system) at the second temperature range (e.g., ~40 C) for the second time period (e.g., ~39.7 days) that is not within the threshold (10%) of the target temperature-accelerated time period (e.g., ~30.0 days), and 2) temperature-accelerated equivalent operation of the second page (e.g., the middle page (MP) in the storage system) at the second temperature range (e.g., 40 C) for the third time period (e.g., ~34.5 days) that is not within the threshold (10%) of the target temperature-accelerated time period (e.g., ~30.0 days).

A read scan operation may then be performed to read data from the third page in the storage system to generate test data. In an embodiment, the testing computing device connected to the testing board may perform a read scan operation on the storage system in order to read data from each of the lower page, the middle page, and the upper page in the storage system in order to generate test data for the upper page, while discarding the data read from the lower and the middle page due to the temperature-accelerated equivalent operation of the lower page and the middle page at the second temperature range (e.g., ~40 C) for the time periods (e.g., ~39.7 days and ~34.5 days) not being within the threshold (e.g., 10%) of the target temperature-accelerated time period (e.g., ~30.0 days).

Following block 610 or block 612, the method 600 proceeds to decision block 614 where the method 600 proceeds depending on whether the test reads have been completed. As will be appreciated by one of skill in the art in possession of the present disclosure, the method 600 may continue until the storage system is tested fully according to the entire temperature-accelerated solid-state storage testing schedule 800 of FIG. 8, which includes performing all the "bake" operations and corresponding read scan operations identified therein. If, at decision block 614, the test reads have not been completed, the method 600 returns to decision block 606. As such, the method 600 may loop such that blocks 606 and 608 are performed for each of steps 3, 5, and 6 of the temperature-accelerated solid-state storage testing schedule 800 of FIG. 8, and block 612 is performed for each of steps 4, 7, and 8 of the temperature-accelerated solid-state storage testing schedule 800 of FIG. 8.

If at decision block 614, the test reads have been completed, the method 600 proceeds to block 616 where a test result is generated using the test data, and a test-result-driven operation associated with the storage system is performed based on the test result. In an embodiment, at block 616 and following the completion of the "bake" operations and read scan operations identified in the temperature-accelerated solid-state storage testing schedule 800 of FIG. 8, the testing computing device discussed above that generated the test data via the read scan operations performed following each "bake" operation at the iterations of blocks 610 and 612 will operate to use that test data to generate a test result. FIGS. 10 and 11 illustrate embodiments of test results that may be generated using test data produced via any of the methods of the present disclosure, and are discussed in further detail below. Furthermore, at block 616, the testing computing device may perform a test-result-driven operations associated with the storage system based on the test results, which as discussed below with reference to FIGS. 10 and 11 may include utilizing the test result to provide for the configuration of solid-state storage systems in a manner that minimizes errors in data stored therein, ensure that errors included in data read from solid-state storage systems during their lifetime are at acceptable levels, and/or perform other testing-result-driven operations known in the art.

Thus, systems and methods have been described that provide for identification of a first temperature range that produces temperature-accelerated equivalent operation of different pages in a storage system at a second temperature range for respective time periods that are within a target-temperature accelerated time period, and the use of the first temperature range to temperature-accelerate the operation of those different pages to allow a single read scan operation on the storage system to generate test data from both those different pages. For example, the temperature-accelerated solid-state storage testing method of the present disclosure may include defining a target temperature-accelerated time period, and identifying a first time period at which 1) subjecting a first page in a storage system to a first temperature range will cause the operation of the first page in the storage system to be equivalent to operating at a second temperature range that is less than the first temperature range and for a second time period that is within a threshold of the target temperature-accelerated time period, and 2) subjecting a second page in the storage system to the first temperature range will cause the operation of the second page in the storage system to be equivalent to operating at the second temperature range for a third time period that is within the threshold of the target temperature-accelerated time period.

Data is then written to the first page and the second page in the storage system, and the storage system is subjected to the first temperature range for the first time period in order to 1) cause the operation of the first page in the storage system to be equivalent to operating at the second temperature range for the second time period, and 2) cause the operation of the second page in the storage system to be equivalent to operating at the second temperature range for the third time period. The data in the first page and the second page in the storage system is then read subsequent to the first time period using a single read scan operation in order to generate first test data. As such, storage systems may be tested while minimizing read scan operations that can interfere with test results, thus providing for more accurate testing of the storage systems.

With reference to FIG. 9, a temperature-accelerated solid-state storage testing schedule 900 is illustrated that combines the read-scan-compensated temperature-accelerated solid-state storage testing schedule 502 of FIG. 5B with the temperature-accelerated solid-state storage testing schedule 800 of FIG. 8, and that may utilized in a combined method in which the blocks of both the methods 300 and 600 are performed. For example, as can be seen in FIG. 9, step 1 of the temperature-accelerated solid-state storage testing schedule 900 identifies a "bake" time (e.g., ~7.4 hours) that produces equivalent operating times (e.g., ~32.4 days and ~28.2 days) for the lower page (LP) and middle page (MP) in the storage system that are within the threshold (e.g., 10% or 3.0 days) of the target temperature-accelerated time period (e.g., ~30.0 days), thus allowing a single scan operation at step 1 following that the corresponding "bake" operation to generate test data for both the lower page (LP) and upper page (UP) in the storage system. Furthermore, step 1 of the temperature-accelerated solid-state storage testing schedule 900 also identifies the equivalent operating time produced in the storage system by performing the read scan operation at ~55 C for ~6.0 hours during step 1, and may adjust the "bake" time of the "bake" operation performed at step 2 of the temperature-accelerated solid-state storage testing schedule 900 based on that equivalent operating time.

As such, similarly as described above for block 302 of the method 300 and block 605 of the method 600, data may be written to a first page, a second page, and a third page (e.g., the lower page, middle page, and upper page) in a storage system. Furthermore, similarly as described above for block 304 of the method 300 and blocks 604 and 608 of the method 600, the storage system may be subjected to a first temperature range (e.g., ~85 C) for a first time period (e.g., ~7.4 hours) in order to 1) cause the operation of the first page in the storage system (e.g., the lower page (LP)) to be equivalent to operating at a second temperature range (e.g., ~40 C) that is less than the first temperature range (e.g., ~85 C) and for a second time period (e.g., ~32.4 days) that is greater than the first time period (e.g., ~7.4 hours) and within a threshold (e.g., 10%) of a target temperature-accelerated time period (e.g., ~30.0 days), and 2) cause the operation of the second page in the storage system (e.g., the middle page (MP)) to be equivalent to operating at the second temperature range (e.g., ~40 C) for a third time period (e.g., ~28.2 days) that is greater than the first time period (e.g., ~7.4 hours) and within the threshold (e.g., 10%) of the target temperature-accelerated time period (e.g., ~30.0 days).

Further still, similarly as described above for block 306 of the method 300 and block 610 of the method 600, subsequent to the first time period (e.g., ~7.4 hours) using a single read scan operation and within a fourth time period (e.g., ~6.0 hours) at a third temperature range (e.g., ~55 C) that is less than the first temperature range (e.g., ~85 C), the data may be read from the first page (e.g., the lower page) and the second page (e.g., the middle page) in the storage system to generate first test data. Further still, similarly as described above for block 308 of the method 300, the storage system may be subject to the first temperature range (e.g., ~85 C) for a fifth time period (e.g., ~1.4 hours) that is less than the first time period (e.g., ~7.4 hours) and that was reduced based on the reading of the data from the first page (e.g., the lower page) and the second page (e.g., the middle page) in the storage system within the fourth time period (e.g., ~6.0 hours) at the third temperature range (e.g., ~55 C) causing the operation of storage system to be equivalent to operating at the second temperature range (e.g., ~40 C) for a sixth time period (e.g., ~1.4 hours). Further still, similarly as described above for block 306 of the method 300, subsequent to the fifth time period (e.g., ~1.4 hours) and within the fourth time period (e.g., ~6.0 hours) at the third temperature range (e.g., ~55 C), the data may be read from the third page (e.g., the upper page) in the storage system to generate second test data. Finally, one of skill in the art in possession of the present disclosure will appreciate how these operations may be repeated to perform each of the "bake" operations and read scan operations identified in the temperature-accelerated solid-state storage testing schedule 900 of FIG. 9 to generate corresponding test data, followed by the generation of a test result and the use of that test result to perform test-result-driven operations associated with the storage system similarly as described above for block 312 of the method 300 and block 616 of the method 600.

With reference to FIG. 10, an embodiment of a test result 1000 that may be generated using any of the methods discussed above is illustrated. As will be appreciated by one of skill in the art in possession of the present disclosure, the test result 1000 provides a graph of a probability distribution of the number of incorrect bits (e.g., a Flipped Bit Count (FBC)) per codeword, with probability (Pr[-]) on the Y-axis and the number of incorrect bits/codeword on the X-axis. As discussed above, the test data generated in response to the read scan operations performed during the methods discussed above may include errors relative to the data that was written to the storage system, and thus may be analyzed, processed, and/or other determined to include a number of incorrect bits per codeword. As such, one of skill in the art in possession of the present disclosure will appreciate how a plurality of the test data generated during the methods discussed above may allow for the generation of the test result 1000 that provides the probability of the number of incorrect bits per codeword illustrated in FIG. 10, and that indicates a distribution of errors in the data that was read following testing vs. the data that was written prior to testing.

For example, incorrect bits/codeword distributions may be provided on a per-page basis, and as discussed above different pages will have different activation energies (Ea). As such, continuing with the Multi-Layer Cell (MLC) examples provided above, the lower pages may be assumed to have the activation energy of 1.0 and may provide the lower page distribution 1002 identified in the test result 1000 for any particular "bake" time that provides a particular temperature-accelerated equivalent operating time, while the upper pages may be assumed to have the activation energy of 0.94 and may provide the upper page distribution 1004 identified in the test result 1000 for any particular "bake" time that provides the particular temperature-accelerated equivalent operating time. Furthermore, the lower page distribution 1002 and the upper page distribution 1004 may be utilized to generate a combined distribution 1006 that falls between the lower page distribution 1002 and the upper page distribution 1004 and may provide the overall test result upon which test-drive-operations may be performed. As will be appreciated by one of skill in the art in possession of the present disclosure, the combined distribution 1006 is not a measurement made during testing, but uses such testing measurements to generate a distribution that indicates where uncorrectable errors may occur in the storage system in real-life scenarios. As will be appreciated by one of skill in the art in possession of the present disclosure, test-driven-operations performed based on the combined distribution 1006 may include a variety of conventional techniques that provide for the determination of voltages that may be utilized with the storage system to reduce errors.

With reference to FIG. 11, an embodiment of test results 1100a and 1100b that may be generated using any of the methods discussed above are illustrated. As will be appreciated by one of skill in the art in possession of the present disclosure, the test result 1100 provides a graph of a probability distribution of NAND voltage ranges, with probability (Pr[-]) on the Y-axis and the NAND voltage ranges on the X-axis. As will be appreciated by one of skill in the art in possession of the present disclosure, the test result 1100a illustrates three voltage scan curves that may be generated by scanning across a NAND memory cell and determining whether "1's" or "0's" are identified: a first voltage scan curve 1102 that may have been generated using any of the methods above following a first "bake" time that provides a particular temperature-accelerated equivalent operating time, a second voltage scan curve 1104 that may have been generated using any of the methods above following a second "bake" time that provides the particular temperature-accelerated equivalent operating time, and a third voltage scan curve 1106 that may have been generated using any of the methods above following a third "bake" time that provides the particular temperature-accelerated equivalent operating time. Furthermore, the test result 1100b combines the voltage scan curves 1102, 1004, and 1106 to provide an overall test result upon which the test-driven-operations may be performed, and which includes "valley" portions 1108 that identify relatively high probability bit count sections where bit errors are unlikely. The inventors of the present disclosure have found that the combined voltage scan curves 1102, 1004, and 1106 approximate real-world operation closely, and thus the test result 1100b may be utilized to perform test-driven-operations such as configuring the storage system with reference voltages at the valley portions 1108 in order to separate bit states and improve the Quality of Service (QoS) of the storage system (e.g., via a reduced time spent retrying reads or correcting errors), as well as perform other control strategy operations that would be apparent to one of skill in the art in possession of the present disclosure.

While temperature-accelerated solid-state storage methods have been described that test how voltages from lower pages, middle pages, and upper pages in a storage system change as a function of time spent at an elevated temperature, one of skill in the art in possession of the present disclosure will recognize how the teaching provided herein may be utilized to test how voltages in a storage system decay based on other acceleration mechanisms as well.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A temperature-accelerated solid-state storage testing method, comprising:
    writing data to a storage system;
    subjecting the storage system to a first temperature range for a first time period in order to cause the operation of storage system to be equivalent to operating at a second temperature range that is less than the first temperature range and for a second time period that is greater than the first time period;
    reading, subsequent to the first time period and within a third time period at a third temperature range that is less than the first temperature range, the data from the storage system to generate first test data;
    subjecting the storage system to the first temperature range for a fourth time period that is less than the first time period and that was reduced based on the reading of the data from the storage system within the third time period at the third temperature range causing the operation of storage system to be equivalent to operating at the second temperature range for a fifth time period; and
    reading, subsequent to the fourth time period and within the third time period at the third temperature range, the data from the storage system to generate second test data.

2. The method of claim 1, wherein the first temperature range is between 70 degrees Celsius and 90 degrees Celsius.

3. The method of claim 1, wherein the third temperature range is between 35 degrees Celsius and 70 degrees Celsius.

4. The method of claim 1, wherein the third time period is 7 hours.

5. The method of claim 1, wherein the fourth time period is less than the first time period by at least 10 minutes.

6. The method of claim 1, further comprising:
    generating, using the first test data and the second test data, a test result; and
    performing, based on the test result, at least one test-result-driven operation associated with the storage system.

7. A temperature-accelerated solid-state storage testing method, comprising:
    defining a target temperature-accelerated time period;
    identifying a first time period at which:
        subjecting a first page in a storage system to a first temperature range will cause the operation of the first page in the storage system to be equivalent to operating at a second temperature range that is less than the first temperature range and for a second time period that is within a threshold of the target temperature-accelerated time period; and
        subjecting a second page in the storage system to the first temperature range will cause the operation of the second page in the storage system to be equivalent to operating at the second temperature range for a third time period that is within the threshold of the target temperature-accelerated time period;
    writing data to the first page and the second page in the storage system;
    subjecting the storage system to the first temperature range for the first time period in order to 1) cause the operation of the first page in the storage system to be equivalent to operating at the second temperature range for the second time period, and 2) cause the operation of the second page in the storage system to be equivalent to operating at the second temperature range for the third time period;
    reading, subsequent to the first time period using a single read scan operation, the data from the first page and the second page in the storage system to generate first test data.

8. The IHS of claim 7, wherein the first temperature range is between 70 degrees Celsius and 90 degrees Celsius.

9. The IHS of claim 7, wherein the second temperature range is between 35 degrees Celsius and 45 degrees Celsius.

10. The IHS of claim 7, wherein target temperature-accelerated time period is between 25 days and 35 days.

11. The IHS of claim 7, wherein threshold of the target temperature-accelerated time period is 10%.

12. The IHS of claim 7, wherein the first page in the storage system includes a first activation energy, and wherein the second page in the storage system includes a second activation energy that is different than the first activation energy.

13. The IHS of claim 7, further comprising:
    generating, using the first test data, a test result; and
    performing, based on the test result, at least one test-result-driven operation associated with the storage system.

14. A temperature-accelerated solid-state storage testing method, comprising:
    writing data to a first page, a second page, and a third page in a storage system;
    subjecting the storage system to a first temperature range for a first time period in order to 1) cause the operation of the first page in the storage system to be equivalent to operating at a second temperature range that is less than the first temperature range and for a second time period that is greater than the first time period and within a threshold of a target temperature-accelerated time period, and 2) cause the operation of the second page in the storage system to be equivalent to operating at the second temperature range for a third time period that is greater than the first time period and within the threshold of the target temperature-accelerated time period;
    reading, subsequent to the first time period using a single read scan operation and within a fourth time period at a third temperature range that is less than the first temperature range, the data from the first page and the second page in the storage system to generate first test data;
    subjecting the storage system to the first temperature range for a fifth time period that is less than the first time period and that was reduced based on the reading of the data from the first page and the second page in the storage system within the fourth time period at the third temperature range causing the operation of storage system to be equivalent to operating at the second temperature range for a sixth time period; and reading, subsequent to the fifth time period and within the fourth time period at the third temperature range, the data from the third page in the storage system to generate second test data.

15. The method of claim 14, wherein the first temperature range is between 70 degrees Celsius and 90 degrees Celsius.

16. The method of claim 14, wherein the third temperature range is between 35 degrees Celsius and 70 degrees Celsius.

17. The method of claim 14, wherein target temperature-accelerated time period is between 25 days and 35 days.

18. The method of claim 14, wherein threshold of the target temperature-accelerated time period is 10%.

19. The method of claim 14, wherein the first page in the storage system includes a first activation energy, wherein the second page in the storage system includes a second activation energy that is different than the first activation energy, and wherein the third page in the storage system includes a third activation energy that is different than the first activation energy and the second activation energy.

20. The method of claim 14, further comprising:
generating, using the first test data and the second test data, a test result; and
performing, based on the test result, at least one test-result-driven operation associated with the storage system.

* * * * *